(12) United States Patent
Kushnir et al.

(10) Patent No.: US 9,571,112 B2
(45) Date of Patent: Feb. 14, 2017

(54) STACKED SYNTHESIZER FOR WIDE LOCAL OSCILLATOR GENERATION USING A DYNAMIC DIVIDER

(71) Applicant: MAXLINEAR ASIA SINGAPORE PRIVATE LIMITED, Singapore (SG)

(72) Inventors: Igal Kushnir, Azur (IL); Hung-Ming Chien, Irvine, CA (US); Wei-Hong Chen, Tustin, CA (US); Theodoros Chalvatzis, Athens (GR); Seunghwan Yoon, Irvine, CA (US); Chin-Ming Chien, Irvine, CA (US); Tirdad Sowlati, Irvine, CA (US); Moche Cohen, Pardes Hanna (IL); Kobi Sturkovich, Netanya (IL); Shaul Klein, Raanana (IL)

(73) Assignee: MAXLINEAR ASIA SINGAPORE PTE LTD., Singapore (SG)

( * ) Notice: Subject to any disclaimer, the term of this patent is extended or adjusted under 35 U.S.C. 154(b) by 118 days.

(21) Appl. No.: 14/191,533

(22) Filed: Feb. 27, 2014

(65) Prior Publication Data

US 2015/0222281 A1    Aug. 6, 2015

Related U.S. Application Data

(60) Provisional application No. 61/935,972, filed on Feb. 5, 2014.

(51) Int. Cl.
*H03B 21/00* (2006.01)
*H03L 7/18* (2006.01)
(Continued)

(52) U.S. Cl.
CPC .............. *H03L 7/18* (2013.01); *H03B 19/00* (2013.01); *H03B 21/00* (2013.01); *H03L 7/099* (2013.01)

(58) Field of Classification Search
USPC ........................................... 327/105
See application file for complete search history.

(56) References Cited

U.S. PATENT DOCUMENTS 5,644,260 A * 7/1997 DaSilva ............... H03C 1/52
                                              327/238
6,914,464 B2 * 7/2005 Maeda ............... H03L 7/1806
                                              327/147

(Continued)

OTHER PUBLICATIONS

Wang et al., "Low Phase Noise SiGe Voltage-controlled Oscillators for wireless Application", Microwave Journal, Feb. 1, 2002.*

(Continued)

*Primary Examiner* — Lincoln Donovan
*Assistant Examiner* — Patrick Chen
(74) *Attorney, Agent, or Firm* — McAndrews, Held & Malloy, Ltd.

(57) ABSTRACT

A stacked synthesizer for wide local oscillator (LO) generation using a dynamic divider. The phase locked loop can include a plurality of voltage controlled oscillators (VCOs), and a selector that can be configured to select an output of one of the plurality of VCOs. The selected output of one of the plurality of VCOs can be provided to an on-chip dynamic divider and to an off-chip dynamic divider for LO sharing. The dynamic dividers can be configured to generate synthesizer outputs based on a multiplication of the selected output of one of the plurality of VCOs by a factor (1+1/M), where M is a variable number.

15 Claims, 7 Drawing Sheets

(51) Int. Cl.
   *H03L 7/099*   (2006.01)
   *H03B 19/00*   (2006.01)

(56) References Cited

U.S. PATENT DOCUMENTS

| | | | |
|---|---|---|---|
| 2002/0024364 A1* | 2/2002 | Aoki ...................... | H03B 21/02 |
| | | | 327/105 |
| 2010/0097106 A1* | 4/2010 | Kravitz ................ | H03B 21/025 |
| | | | 327/117 |
| 2011/0032040 A1* | 2/2011 | Beghini ............... | H03C 3/0941 |
| | | | 331/2 |
| 2011/0148484 A1* | 6/2011 | Kim ........................ | H03L 7/099 |
| | | | 327/148 |

OTHER PUBLICATIONS

European Search Report for EP 15000111.3 mailed Jun. 30, 2015.

\* cited by examiner

US 9,571,112 B2

STACKED SYNTHESIZER FOR WIDE LOCAL OSCILLATOR GENERATION USING A DYNAMIC DIVIDER

This application claims the benefit of and priority to provisional application No. 61/935,972, filed Feb. 5, 2014, which is incorporated herein by reference in its entirety.

BACKGROUND

Field

The present disclosure relates generally to digital communications, and includes a disclosure of an example stacked synthesizer for wide local oscillator generation using a dynamic divider.

Introduction

Microwave backhaul architectures are evolving as mobile backhaul providers are experiencing a growing demand for increased capacity as well as a shift from voice services to data services. These factors are driving mobile backhaul networks towards higher capacity connections.

BRIEF DESCRIPTION OF THE DRAWINGS

In order to describe the manner in which the above-recited and other advantages and features can be obtained, a more particular description will be rendered by reference to specific embodiments thereof which are illustrated in the appended drawings. Understanding that these drawings depict only typical embodiments and are not therefore to be considered limiting of its scope, the disclosure describes and explains with additional specificity and detail through the use of the accompanying drawings in which.

DETAILED DESCRIPTION

Figure 1:
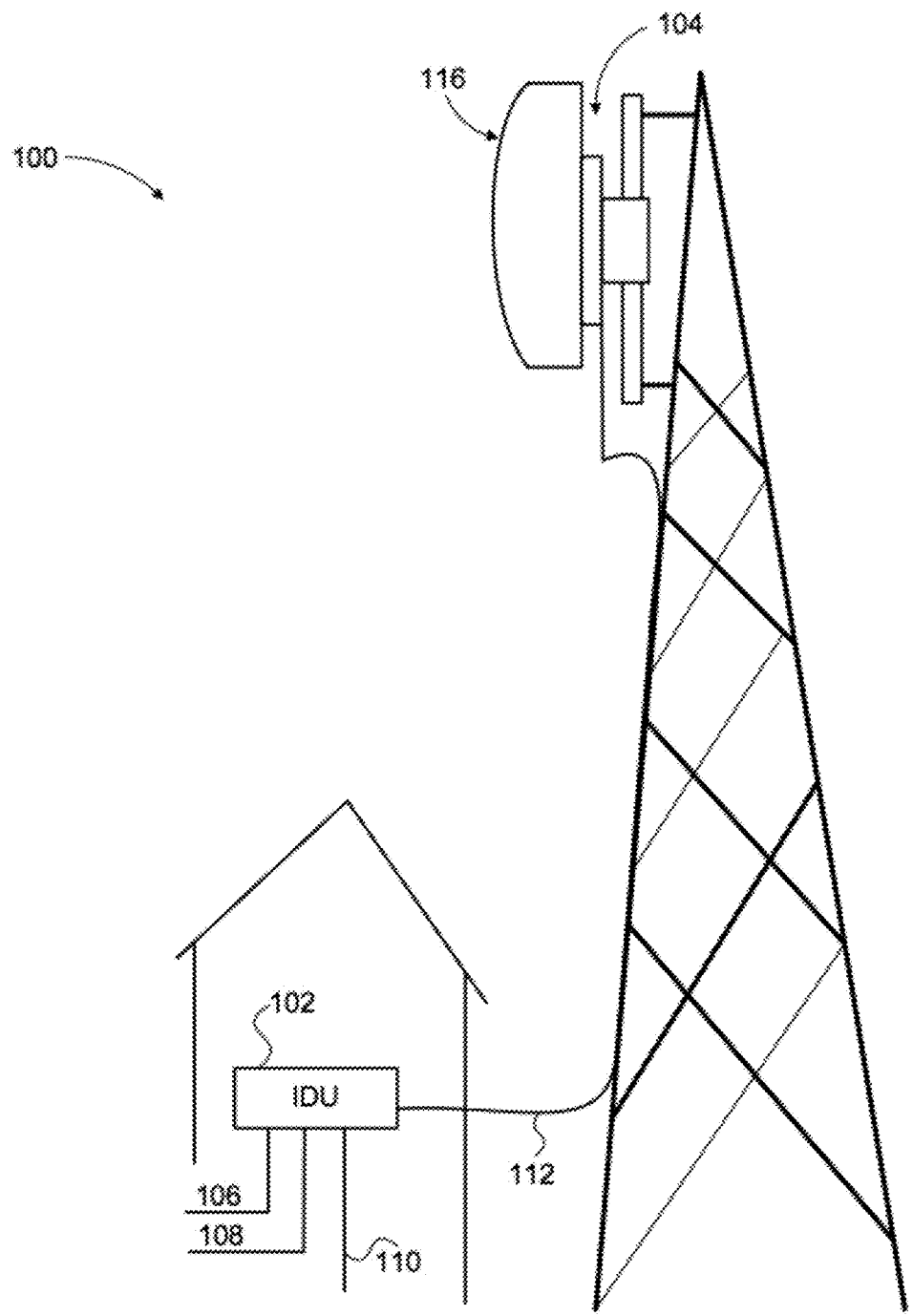
FIG. 1 illustrates a block diagram of a microwave backhaul system according to an exemplary embodiment.

Various embodiments are discussed in detail below. While specific implementations are discussed, it should be understood that this is done for illustration purposes only. A person skilled in the relevant art will recognize that other components and configurations may be used without parting from the spirit and scope of the present disclosure.

The microwave backhaul world is growing due to increased bandwidth demands. The capacity of a microwave backhaul system can be increased through a rise in modulation (e.g., 4096 quadrature amplitude modulation (QAM), 8096 QAM, 16198 QAM, and higher modulations), evolvement of single-input, single-output (SISO) systems to cross-polarization (XPIC) and geometric multiple-input, multiple-output (MIMO) systems, etc. Phase noise is one of the largest obstacles in accommodating this evolution of capacity in microwave backhaul systems. As will be described in greater detail below, low phase noise can be produced by a stacked synthesizer for wide local oscillator generation using a dynamic divider.

In one embodiment, a synthesizer integrated circuit is provided that includes a phase locked loop. The phase locked loop can include a plurality of voltage controlled oscillators, and a selector that can be configured to select an output of one of the plurality of voltage controlled oscillators and provide the selected output onto an output line. The synthesizer integrated circuit also includes a dynamic divider coupled to the output line, wherein the dynamic divider is configured to receive an output of the selected output of one of the plurality of voltage controlled oscillators on the output line and to generate a synthesizer output based on a multiplication of the selected output of one of the plurality of voltage controlled oscillators by a factor (1+1/M), where M is a variable number (e.g., an integer value). In one embodiment, the plurality of voltage controlled oscillators are SiGe voltage controlled oscillators.

In one embodiment, the synthesizer integrated circuit can be configured for local oscillator sharing. In this embodiment, the synthesizer integrated circuit can include an output that is configured to transmit the selected output of one of the plurality of voltage controlled oscillators to a second synthesizer integrated circuit. Further, the synthesizer integrated circuit can include an input that is configured to receive a selected output of one of a second plurality of voltage controlled oscillators in a second synthesizer integrated circuit, wherein the input is coupled to the output line.

In one example application, the principles described herein can be applied to a microwave backhaul system, wherein the synthesizer can be configured to generate microwave radio frequency signals. Microwave, as used throughout this disclosure, can refer to both terrestrial point-to-point (PtP) radio communications, as well as point-to-multipoint communications. In one example, the synthesizer can generate frequencies usable in the range of 5.92 Ghz-43.5 Ghz. As would be appreciated, the principles of the present disclosure are not limited to microwave backhaul system applications, nor to a particular frequency range of application. The reference to a particular example applied to a microwave backhaul system application is not intended to be limiting.

FIG. 1 illustrates an example microwave backhaul environment in which a stacked synthesizer can be used. As illustrated, microwave backhaul system 100 includes indoor unit (IDU) 102 and outdoor unit (ODU) 104. Microwave backhaul system 100 initiates communication by accessing an information source, which can comprise, for example, audio data 106, video data 108, or any other data capable of being transmitted over an Internet Protocol (IP)/Ethernet connection 110. To facilitate this communication, IDU 102 can be coupled to a core network. In particular, IDU 102 can be configured to acquire one or more sequences of digital data (e.g., audio data 106, video data 108, data transmitted over IP/Ethernet connection 110, or the like) from the core network. IDU 102 can also be configured to support several additional services, such as Ethernet, time-division multiplexing (TDM), and control data that is aggregated over a radio link.

IDU 102 can be implemented at a location that is substantially removed from ODU 104, such as at a location at ground level. For example, IDU 102 can be positioned inside of a home or an office building, or the like. Conversely, ODU 104 can be implemented at a substantially elevated location, such as on top of a pole, on top of an antenna tower, on top of a building, or the like. In some embodiments, IDU 102 and ODU 104 can be separated by a significant distance (e.g., up to approximately 300 meters). In general, IDU 102 can include a modem assembly, while ODU 104 can include at least some RF functionalities as well as corresponding digital capabilities.

IDU 102 and ODU 104 are connected via communication pathway 112, which can be configured such that data can be transmitted between IDU 102 and ODU 104. In various examples, communication pathway 112 can comprise a twisted pair Ethernet cable, a fiber optic cable, a coaxial cable, an intermediate frequency (IF) cable, etc. Therefore, depending on a chosen communication medium, communication pathway 112 can facilitate transmission of an analog signal or a digital signal between IDU 102 and ODU 104. In some embodiments, communication pathway 112 can be a wireless communication channel.

Antenna 116 can be coupled to ODU 104, and can be positioned close to ODU 104. Therefore, microwave backhaul system 100 can be implemented such that data can be transmitted from IDU 102, across communication pathway 112, to ODU 104, and subsequently to antenna 116 where communication over a wireless link can then be initiated. Also, microwave backhaul system 100 can be implemented such that data received by antenna 116 can be transmitted from ODU 104 over communication pathway 112 to IDU 102.

In various embodiments, communication pathway 112 can be configured to carry a plurality of channels. For example, communication pathway 112 can be implemented such that four transmission channels and four receipt channels can each coexist over communication pathway 112 at any given time. As would be appreciated, communication pathway 112 can be implemented in various ways to carry an increasing number of transmission/receipt channels, thereby expanding the capacity of microwave backhaul system 100.

In one embodiment, ODU 104 can correct errors associated with a signal received over a wireless link via antenna 116. Microwave backhaul system 100 can also be configured to support adaptive coding and modulation (ACM), which provides high reliability of microwave backhaul system 100 even in extreme weather, such as wind, rain, hail, or the like. For example, ACM can adapt coding and modulation rates to changing environmental conditions to thereby increase throughput over a link and make efficient use of the existing spectrum. Thus, ACM enables the ODU to hitlessly manage the transitions when adjusting the number of transmission/receipt channels based on the changes in the communication channel.

Figure 2:
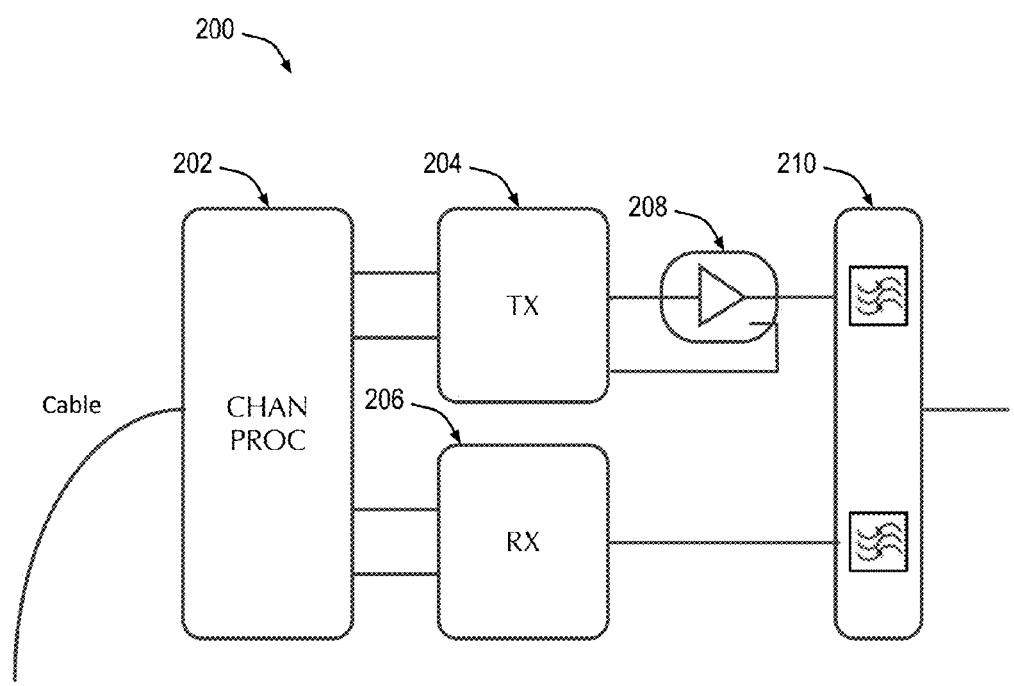
FIG. 2 illustrates a high-level block diagram of an outdoor unit for implementation within a microwave backhaul system.

FIG. 2 illustrates a high-level block diagram of an ODU for implementation within a microwave backhaul system. As illustrated, ODU 200 can include channel processing block 202, transmission block 204, reception block 206, power amplifier 208, and diplexer 210. In one embodiment, channel processing block 202 can be configured to interface with a cable that can be configured to carry one or more channels between ODU 200 and an IDU.

In one embodiment, transmission block 204 receives analog baseband In-phase (I) and Quadrature (Q) signals from channel processing block 202. In one embodiment, the digital baseband signals have undergone adaptive pre-distortion and adaptive I/Q correction based on feedback from transmission block 204. After the analog baseband signals have undergone ADC and filtering of the I and Q signals, the respective I and Q signals are used by an upconversion module to convert the signals to the RF domain (e.g., 5.92 GHz to approximately 43.5 GHz) using a local oscillator. Similarly, reception block 206 can includes a conversion module that is configured to convert a signal from RF to baseband. In one embodiment, reception block 206 can be configured to transmit analog baseband I and Q signals to channel processing module 202.

Figure 3:
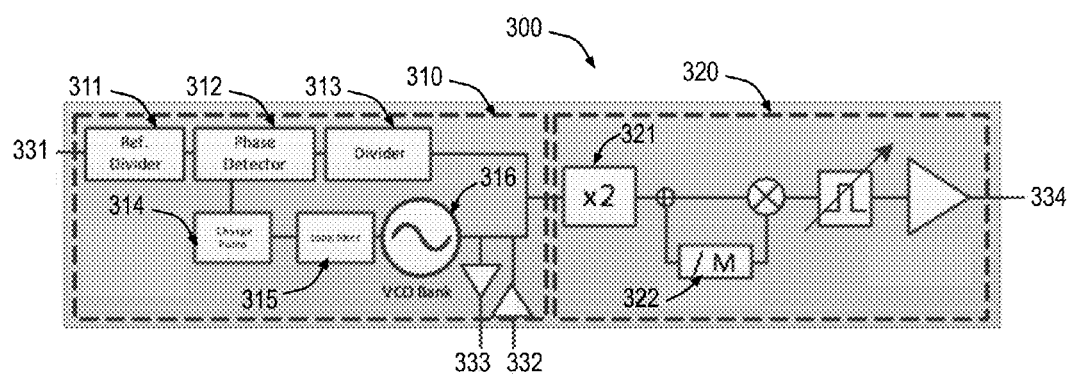
FIG. 3 illustrates an example embodiment of a stacked synthesizer for wide local oscillator generation using a dynamic divider.

FIG. 3 illustrates an example embodiment of a stacked synthesizer for wide local oscillator generation using a dynamic divider. As illustrated, stacked synthesizer 300 includes a phase locked loop (PLL) 310 and dynamic divider 320. As illustrated, stacked synthesizer also includes VCO input 332 and VCO output 333. The function of VCO input 332 and VCO output 333 are described in greater detail below in the context of local oscillator sharing.

PLL 310 includes reference divider 311 that is responsive to input reference signal 331 (e.g., 10 MHz-100 MHz signal). The output of reference divider 311 is provided to phase detector 312. Phase detector 312 is configured to compare the phase of the output of reference divider 311 to the output of divider 313. As illustrated, divider 313 receives an output signal from voltage controlled oscillator (VCO) bank 316. VCO bank 316 is controlled based on a control signal produced by charge pump 314 and loop filter 315. As would be appreciated, the particular implementation of PLL 310 can vary and would be implementation dependent.

In one embodiment, VCO bank 316 includes a plurality of stacked, high Q, low tuning range, low phase noise, VCOs. This implementation of VCO bank 316 is in contrast to the use of a single VCO (e.g., GaAs) that has a wider tuning range (e.g., 10%) and good phase noise performance. It is recognized that one of the obstacles of using such a single VCO is that the VCO is difficult to integrate with the PLL and local oscillator generation. Moreover, such integration issues is counter to current market trends of smaller and cheaper devices.

Figure 4:
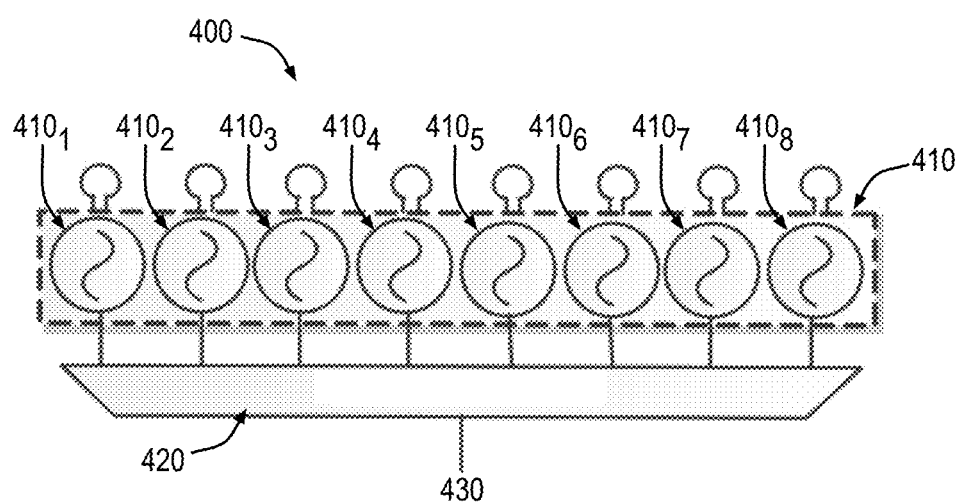
FIG. 4 illustrates an example embodiment of a stacked voltage controlled oscillator bank.

In accommodating such integration, yet not compromising on tuning range and low phase noise, VCO bank 316 is configured with a plurality of stacked VCOs that individually have a smaller tuning range (e.g., 1.5%) and low phase noise. FIG. 4 illustrates an example embodiment of a stacked voltage controlled oscillator bank. As illustrated, VCO bank 400 includes VCO block 410 that contains a plurality of VCOs $410_1$-$410_8$. As would be appreciated, the number of VCOs $410_i$ that are included in VCO block 410 would vary depending on the particular application.

In one example, each VCO in the plurality of VCOs $410_1$-$410_8$ can be configured with a smaller tuning range (e.g., 1.5%), wherein the collective tuning range of the eight VCOs $410_1$-$410_8$ yields a wider tuning range (e.g., ~12%). Here, it is recognized that each of the plurality of VCOs $410_1$-$410_8$ can be implemented using materials (e.g., SiGe) that enables easier integration with the PLL and for wide local oscillator generation using a dynamic divider. As is further illustrated in FIG. 4, VCO bank 400 includes selector 420, which is configured to select an output of one of the plurality of VCOs $410_1$-$410_8$ for output on output line 430.

Returning to FIG. 3, it is recognized that the wider collective tuning range of VCO bank 316, which is enabled using stacked VCOs, can be further widened using dynamic divider 320. In the illustrated embodiment of FIG. 3, dynamic divider 320 includes multiplier and divider elements 321 and 322, respectively. In combination, multiplier and divider elements 321 and 322 enable for wide local oscillator generation using a dynamic divider generation based on the following function:

$$\text{Syn Freq.} = (\text{VCO Freq.}) \times 2 \times (1 + 1/M)$$

The dividing factor M can be used to further widen the tuning range of the synthesizer. In one embodiment, the value of the dividing factor M can be in the range of 2-8. As would be appreciated, other ranges of the dividing factor M can be used to generate a particular tuning range of the synthesizer for a given application.

Figure 5:
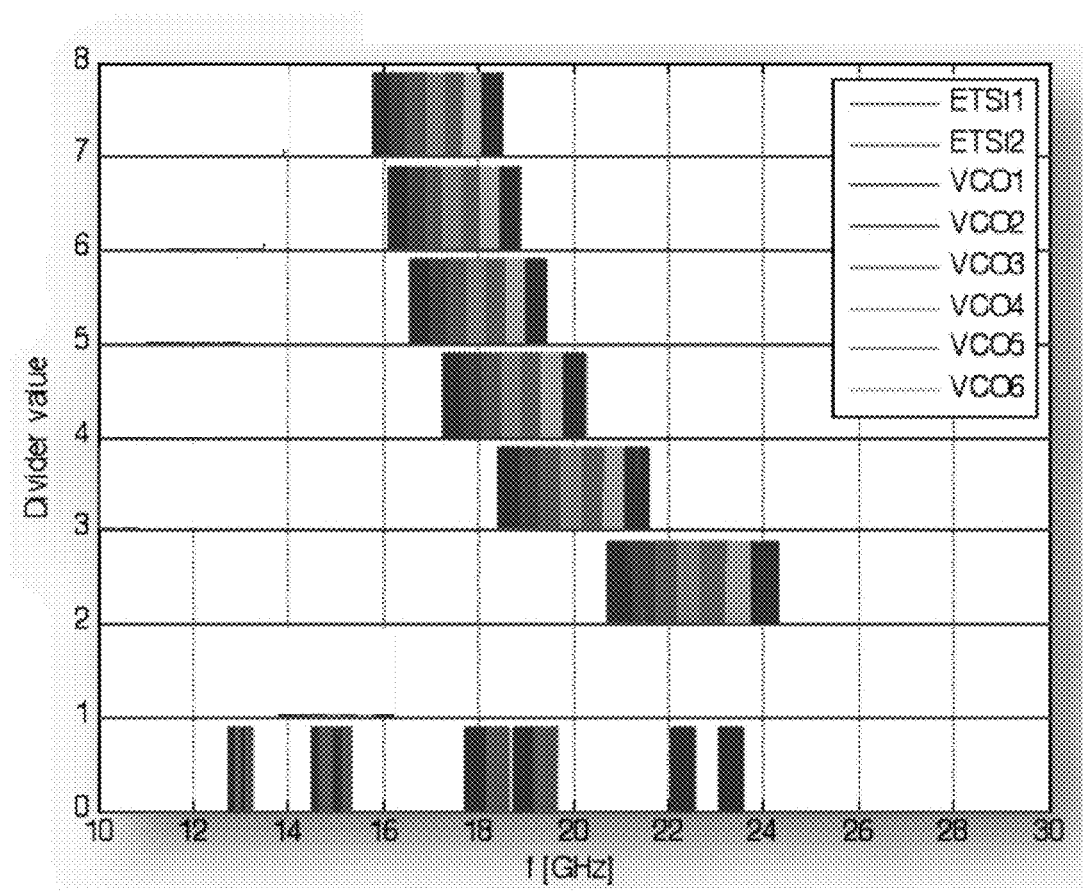
FIG. 5 illustrates an example coverage of a stacked voltage controlled oscillator bank with a dynamic divider.

FIG. 5 illustrates an example of the wide tuning range at microwave frequencies that can be produced using a stacked VCO bank with a dynamic divider. As illustrated, the individual tuning ranges for each of the stacked VCOs in the VCO bank is represented by different color bands that individually span a range of frequencies.

The range of a particular frequency band for a particular VCO in the VCO bank would be implementation dependent. As would be appreciated, the particular tuning range of a particular VCO in the VCO bank can be chosen to cover a defined narrow tuning range (e.g., 1.5%), while maintaining the desired low-phase-noise characteristics.

The range of a particular frequency band for the collective set of stacked VCOs in the VCO bank would also be implementation dependent. As would be appreciated, a desired tuning range of the set of stacked VCOs in the VCO bank can be obtained by identifying a particular number of stacked VCOs included within the VCO bank as well as the particular size of the narrow tuning ranges for the individual VCOs in the VCO bank. Based on these design implementation details, a defined wider tuning range (e.g., 12%) can be produced by the collective set of stacked VCOs in the VCO bank.

As noted in the equation above, the change of the divider value would produce a change in the output synthesizer frequency based on the same VCO frequency. For example, the divider value of M=8 would produce an output synthesizer frequency=(VCO Freq)×2×(1+1/8)=VCO Freq×2.250, the divider value of M=7 would produce an output synthesizer frequency=(VCO Freq)×2×(1+1/7)=VCO Freq×2.286, the divider value of M=6 would produce an output synthesizer frequency=(VCO Freq)×2×(1+1/6)=VCO Freq×2.333, the divider value of M=5 would produce an output synthesizer frequency=(VCO Freq)×2×(1+1/5)=VCO Freq×2.400, etc. In effect, the use of the dynamic divider enables a further widening of the effective tuning range that can be produced using the same set of stacked VCOs.

FIG. 5 illustrates an example coverage of a stacked voltage controlled oscillator bank with a dynamic divider that spans a range of M=2 to 8. As illustrated, the change in the dynamic divider value M produces a different synthesizer output frequency band covered by the collective set of stacked VCOs in the VCO bank. This collective set of output frequency bands produced by the different dynamic divider values produces a wide tuning range for the synthesizer. It is significant to recognize here that a wide-range synthesizer can be produced in a single chip, while retaining best-in-class, low-phase-noise performance.

As noted above, the stacked synthesizer for wide local oscillator generation using a dynamic divider can also support local oscillator sharing for various architectures (e.g., XPIC, MIMO, dual carrier, etc.). This flexible synthesizer can be flexibly applied to architectures that need local oscillator sharing and to architectures that do not need local oscillator sharing.

Figure 6:
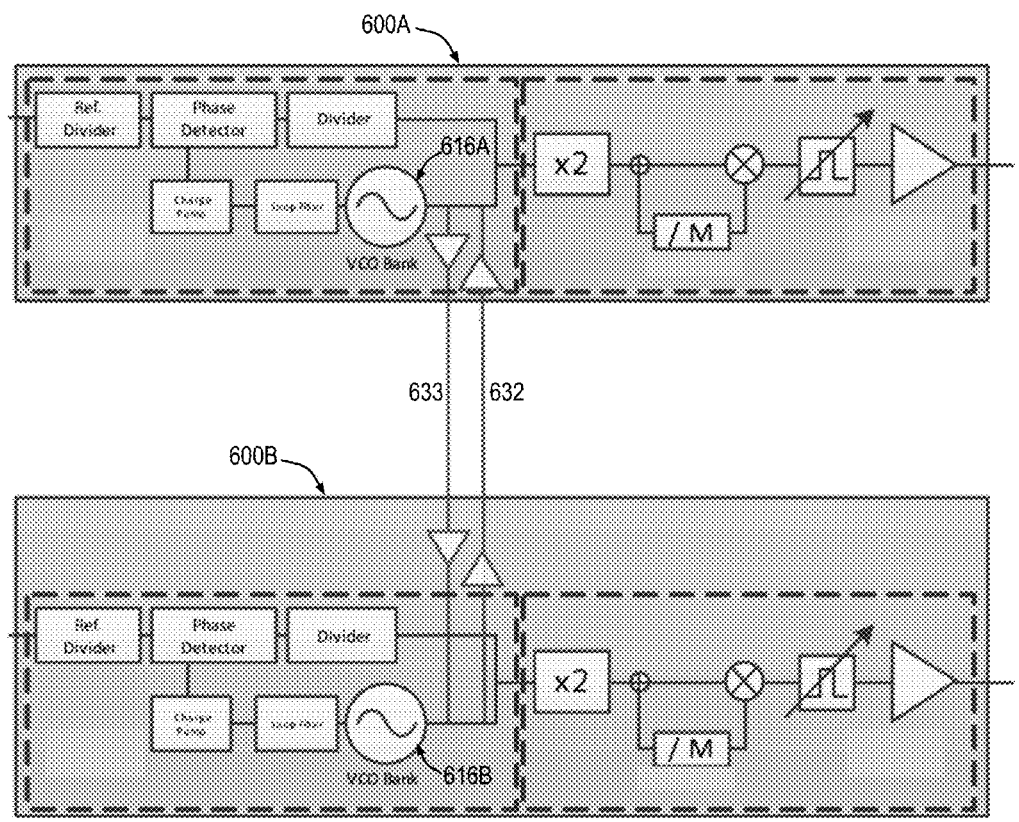
FIG. 6 illustrates an example embodiment of local oscillator sharing between synthesizers.

FIG. 6 illustrates an example embodiment of local oscillator sharing between synthesizers. In this illustrated example, a two-synthesizer configuration is provided with synthesizer 600A and synthesizer 600B. Synthesizer 600A and synthesizer 600B can be implemented in various ways. For example, synthesizer 600A and synthesizer 600B can be implemented on the same board, can be implemented in different boxes, etc.

As illustrated, local oscillator sharing between synthesizer 600A and synthesizer 600B is effected through signal lines 632 and 633, which can be configured to provide input/output of VCO outputs from VCO banks 616A and 616B. For example, the output of VCO bank 616B can be provided as input to synthesizer 600A using signal line 632, while the output of VCO bank 616A can be provided as input to synthesizer 600B using signal line 633. This mode of operation can be used to support a configuration where two transmitters are transmitting on the same frequency. If the two transmitters are transmitting on different frequencies, then synthesizer 600A and synthesizer 600B can produce different frequency outputs using their own VCO banks 616A and 616B, respectively.

On of the advantages of the example architecture illustrated in FIG. 6 is that a reference signal is shared between synthesizer 600A and synthesizer 600B for use by the dynamic divider portions of synthesizer 600A and synthesizer 600B. This is significant because the loss is smaller and more controllable relative to an architecture that shares the exact synthesized signal.

Figure 7:
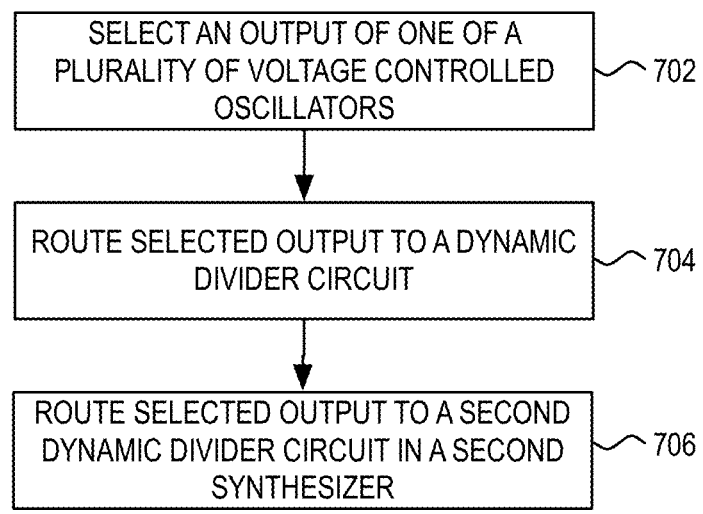
FIG. 7 illustrates an example flowchart of a process.

FIG. 7 illustrates an example flowchart of a process enabled by the present synthesizer architecture. As illustrated, the process begins, at step 702, wherein an output of one of a plurality of VCOs is selected. The plurality of VCOs can be included in a bank of VCOs that is integrated with a PLL. At step 704, the PLL output that is generated using the selected output of one of the plurality of VCOs is then routed to a dynamic divider circuit for generation of a synthesizer output. In one embodiment, the dynamic divider circuit is configured to generate a synthesizer output based on a multiplication of the selected output of one of the plurality of VCOs by a factor (1+1/M), where M is a variable number. Finally, at step 706, the selected output of one of the plurality of VCOs can also be routed to a second dynamic divider circuit in a second synthesizer for production of a second synthesizer output.

Another embodiment of the present disclosure can provide a machine and/or computer readable storage and/or medium, having stored thereon, a machine code and/or a computer program having at least one code section executable by a machine and/or a computer, thereby causing the machine and/or computer to perform the steps as described herein.

Those of skill in the relevant art would appreciate that the various illustrative, circuits, blocks, modules, elements, components, and methods described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Those of skill in the relevant art can implement the described functionality in varying ways for each particular application. Various components and blocks may be arranged differently (e.g., arranged in a different order, or partitioned in a different way) all without departing from the scope of the subject technology.

These and other aspects of the present disclosure will become apparent to those skilled in the relevant art by a review of the preceding detailed disclosure. Although a number of salient features of the present disclosure have been described above, the principles in the present disclosure are capable of other embodiments and of being practiced and carried out in various ways that would be apparent to one of skill in the relevant art after reading the present disclosure, therefore the above disclosure should not be considered to be exclusive of these other embodiments. Also, it is to be understood that the phraseology and terminology employed herein are for the purposes of description and should not be regarded as limiting.

What is claimed is:

1. A synthesizer integrated circuit, comprising:
a phase locked loop, the phase locked loop including:
   a plurality of voltage controlled oscillators; and
   a selector that is configured to select a first output of one of the plurality of voltage controlled oscillators and a second output of one of the plurality of voltage controlled oscillators, the selector being configured to provide the selected first output onto an output line and transmit the selected second output to another synthesizer integrated circuit, wherein the synthesizer integrated circuit and the another synthesizer integrated circuit are on different chips; and
a dynamic divider coupled to the output line, the dynamic divider configured to receive the selected first output of one of the plurality of voltage controlled oscillators on the output line and generate a synthesizer output, the dynamic divider comprising a multiplier element and a divider element, wherein the dynamic divider is configured to:
   use the multiplier element to multiply the selected first output of one of the plurality of voltage controlled oscillators by a first factor, and
   use the divider element to divide an output of the multiplier element by a second factor wherein the second factor is a variable number.

2. The synthesizer integrated circuit of claim 1, wherein the plurality of voltage controlled oscillators are SiGe voltage controlled oscillators.

3. The synthesizer integrated circuit of claim 1, wherein the dynamic divider generates the synthesizer output using a relationship (1+1/M), wherein M is an integer.

4. The synthesizer integrated circuit of claim 1, comprising an input that is configured to receive an output of the another synthesizer integrated circuit.

5. The synthesizer integrated circuit of claim 1, wherein the synthesizer output is a microwave radio frequency.

6. A method, comprising:
selecting first output of one of a plurality of voltage controlled oscillators, wherein the plurality of voltage controlled oscillators are included in a bank of voltage controlled oscillators that is integrated with a phase locked loop on a first synthesizer integrated circuit;
selecting a second output of one of a plurality of voltage controlled oscillators;
transmitting the selected second output to a second synthesizer integrated circuit, wherein the first synthesizer integrated circuit and the second synthesizer integrated circuit are on different chips; and
routing the selected first output of the one of the plurality of voltage controlled oscillators to a dynamic divider circuit, the dynamic divider circuit configured to generate a synthesizer output, the dynamic divider including a multiplier element and a divider element, wherein the synthesizer output is generated by at least:
   multiplying, by the multiplier element, the selected output of one of the plurality of voltage controlled oscillators by a first factor, and
   dividing, by the divider element, an output of the multiplier element by a second factor, where the second factor is a variable number.

7. The method of claim 6, wherein the plurality of voltage controlled oscillators are SiGe voltage controlled oscillators.

8. The method of claim 6, wherein the synthesizer output is generated using a relationship (1+1/M), M is an integer.

9. The method of claim 6, wherein the synthesizer output is a microwave radio frequency.

10. An integrated circuit, comprising:
a phase locked loop, the phase locked loop including:
   a plurality of voltage controlled oscillators; and
   a selector that is configured to select a first output of one of the plurality of voltage controlled oscillators and a second output of one of the plurality of voltage controlled oscillators, the selected second output being transmitted to another integrated circuit, wherein the integrated circuit and the another integrated circuit are on different chips;
a dynamic divider comprising a multiplier element and a divider element, the dynamic divider configured to receive the selected first output of one of the plurality of voltage controlled oscillators and generate a plurality of synthesizer outputs, wherein the multiplier element is configured to multiply the selected first output of one of the plurality of voltage controlled oscillators by a first factor, wherein the divider element is configured to divide an output of the multiplier element by a first one of a plurality of second factors to generate a first synthesizer output, and
wherein the divider element is configured to divide the output of the multiplier element by a second one of the plurality of second factors to generate a second synthesizer output.

11. The integrated circuit of claim 10, wherein the plurality of voltage controlled oscillators are SiGe voltage controlled oscillators.

12. The integrated circuit of claim 10, wherein the selected output is a microwave radio frequency.

13. The integrated circuit of claim 10 wherein each of the plurality of second factors is different from each other.

14. The integrated circuit of claim 13, wherein the plurality of second factors are expressed as (1+1/M), where M is a variable number.

15. The integrated circuit of claim 10, comprising an input that is configured to receive output of another integrated circuit.

* * * * *